United States Patent
Lee et al.

(10) Patent No.: US 8,810,037 B2
(45) Date of Patent: Aug. 19, 2014

(54) SEMICONDUCTOR DEVICE AND METHOD FOR MANUFACTURING THE SAME

(71) Applicant: SK hynix Inc., Incheon-si (KR)

(72) Inventors: Dong Jin Lee, Icheon-si (KR); Dae Jin Park, Icheon-si (KR)

(73) Assignee: SK Hynix Inc., Icheon (KR)

( * ) Notice: Subject to any disclaimer, the term of this patent is extended or adjusted under 35 U.S.C. 154(b) by 59 days.

(21) Appl. No.: 13/717,444

(22) Filed: Dec. 17, 2012

(65) Prior Publication Data

US 2014/0042632 A1   Feb. 13, 2014

(30) Foreign Application Priority Data

Aug. 7, 2012  (KR) .................... 10-2012-0086459

(51) Int. Cl.
*H01L 23/48* (2006.01)
*H01L 23/52* (2006.01)
*H01L 29/40* (2006.01)

(52) U.S. Cl.
CPC ...................................... *H01L 23/48* (2013.01)
USPC ...................................... 257/773; 257/E21.09

(58) Field of Classification Search
CPC ....................................................... H01L 23/48
USPC ............................................. 257/773, E21.09
See application file for complete search history.

(56) References Cited

U.S. PATENT DOCUMENTS

2014/0092686 A1*   4/2014   Shim et al. ............... 365/185.17

FOREIGN PATENT DOCUMENTS

KR   1019990081499 A   11/1999
KR   1020110087848 A   8/2011

* cited by examiner

*Primary Examiner* — David S Blum

(57) ABSTRACT

The semiconductor device includes a semiconductor substrate including a first region straightly connected to a cell string region and a second region adjacent to the first region, a first conductive pattern having a first pitch in the first region, a second conductive pattern connected to the first conductive pattern in the first region and having a structure in which S shaped characters are continuously connected in a zigzag shape, and a third conductive pattern spaced from the second conductive pattern in the second region and having an essentially oval shape in which a central portion thereof is divided. An exposure process margin is improved in an X-decoder region and a failure such as a bridge is reduced to improve characteristics of the semiconductor device.

24 Claims, 10 Drawing Sheets

SEMICONDUCTOR DEVICE AND METHOD FOR MANUFACTURING THE SAME

CROSS-REFERENCES TO RELATED APPLICATION

The present application claims priority to Korean patent application number 10-2012-0086459, filed on 7 Aug. 2012, which is incorporated by reference in its entirety.

BACKGROUND

1. Technical Field

The present invention relates to a semiconductor device and a method for manufacturing the same.

2. Related Art

Most electronic devices include semiconductor devices. The semiconductor devices include electric elements such as transistors, resistors, and capacitors. The electric elements are designed to perform various functions and are integrated on a semiconductor substrate. For example, electronic devices such as computers or digital cameras include semiconductor devices such as a memory chip configured to store information, a processing chip configured to control the information, and the like. The memory chip and processing chip include electronic elements integrated on a semiconductor substrate.

Semiconductor devices need to be more highly integrated for good performance at lower prices to satisfy consumer demand. As the integration of the semiconductor device is increased, the design rule is reduced and patterns of the semiconductor device become miniaturized. As ultra-miniaturization and high integration of semiconductor devices has progressed, total chip area is increased in proportion to an increase in memory capacity. However, the area of a cell region, in which the patterns of the semiconductor device are formed, is actually reduced. Therefore, since many patterns have to be formed in the limited cell region to ensure the desired memory capacity, patterns with reduced critical dimensions (CD) are formed.

However, the development of exposure equipment for implementing fine patterns required for semiconductor devices is not keeping pace with other areas of semiconductor device development. For example, when a photoresist pattern containing silicon is formed by performing an exposure and developing process on a photoresist layer containing silicon using existing equipment, it is difficult to secure a fine photoresist pattern since the exposure equipment has a limited resolution.

Double patterning technology (DPT) is a method of forming fine patterns. DPT is classified into double exposure etch technology (DE2T), which exposes and etches two patterns having a pitch twice the final pattern pitch, and spacer patterning technology (SPT) using a spacer.

The spacer patterning technology is classified into positive spacer patterning technology and negative patterning technology. In general, the positive spacer patterning technology is applied to patterning of a 30 nm-graded semiconductor device.

SUMMARY

According to one embodiment, there is provided a semiconductor device. The semiconductor device may include: a semiconductor substrate including a first region coupled to a cell string region and a second region adjacent to the first region; first conductive patterns having a first pitch and disposed in the first region; second conductive patterns each of which is coupled to a corresponding one of the first conductive patterns in the first region and has a structure in which S shaped are continuously connected in a zigzag shape; and third conductive patterns spaced from the second conductive patterns in the second region and having an essentially oval shape in which a central portion thereof is divided.

The first conductive pattern may be formed in a line and space type.

The second conductive pattern and the third conductive pattern may be arranged in the same pitch as the first conductive pattern.

The first region and the second region may include an X-decoder region of the semiconductor device.

The semiconductor device may further include a first pad pattern coupled to a corresponding one of the second conductive patterns and a second pad pattern spaced from the first pad pattern and coupled to a corresponding one of the second conductive patterns, wherein the first pad pattern and the second pad pattern are electrically isolated from each other.

The first pad pattern and the second pad pattern are coupled to a first portion and a second portion of a corresponding one of the third conductive patterns, respectively, and wherein the first portion and the second portion of the third conductive pattern are separated from each other by the divided central portion.

A metal interconnection may be provided over the first pad pattern and the second pad pattern.

The semiconductor device may further include a metal interconnection provided on the first pad pattern and the second pad pattern.

The first pitch may be substantially the same as a cell pitch of the semiconductor device.

The first conductive patterns may correspond to word lines of the cell string region.

According to another embodiment, there is provided a semiconductor device. The semiconductor device may include: a semiconductor substrate including a first region coupled to a cell string region and a second region adjacent to the first region; first conductive patterns having a first pitch in the first region; second conductive patterns including first patterns arranged in parallel to the first conducive patterns in the first region and having an essentially oval shape in which a central portion thereof is divided and second patterns surrounding the first patterns and coupled to adjacent first conductive patterns; and third conductive patterns spaced from the second conductive patterns in the second region and having an essentially oval shape in which a central portion thereof is divided.

The first conductive patterns may be formed in a line and space type.

The second conductive patterns and the third conductive patterns may be arranged to have substantially the same pitch as the first conductive patterns.

The first region and the second region may include an X-decoder region of the semiconductor device.

The semiconductor device may further include a first pad pattern coupled to a first portion of the second conductive patterns; and a second pad pattern spaced from the first pad pattern and coupled to a second portion of the second conductive patterns, wherein the first portion and the second portion of the second conductive pattern are electrically isolated from each other by the divided central portion.

The first pad pattern may be coupled to the third conductive patterns.

The device may further comprise a metal interconnection provided over the first pad pattern and the second pad pattern.

The semiconductor device may further include a metal interconnection provided on the first pad pattern and the second pad pattern.

The first pitch is substantially the same as a cell pitch of the semiconductor device.

The first conductive patterns correspond to word lines of the cell string region.

According to still another embodiment, there is provided a semiconductor device. The semiconductor device may include: first conductive patterns coupled to a cell string region; second conductive patterns perpendicularly coupled to the first conductive patterns and spaced from the first conductive patterns; and third conductive patterns provided between the second conductive patterns spaced from each other and including spacers in center portions thereof.

The first conductive patterns and the second conductive patterns may have a line and space type.

The third conductive patterns may have an island shape.

The first conductive patterns, second conductive patterns, and third conducive patterns may be provided in an X-decoder region.

The semiconductor device may further include contact pads coupled to the second conductive patterns and obliquely spaced from each other.

The first conductive patterns correspond to word lines of the cell string region.

These and other features, aspects, and embodiments are further herein.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1A:
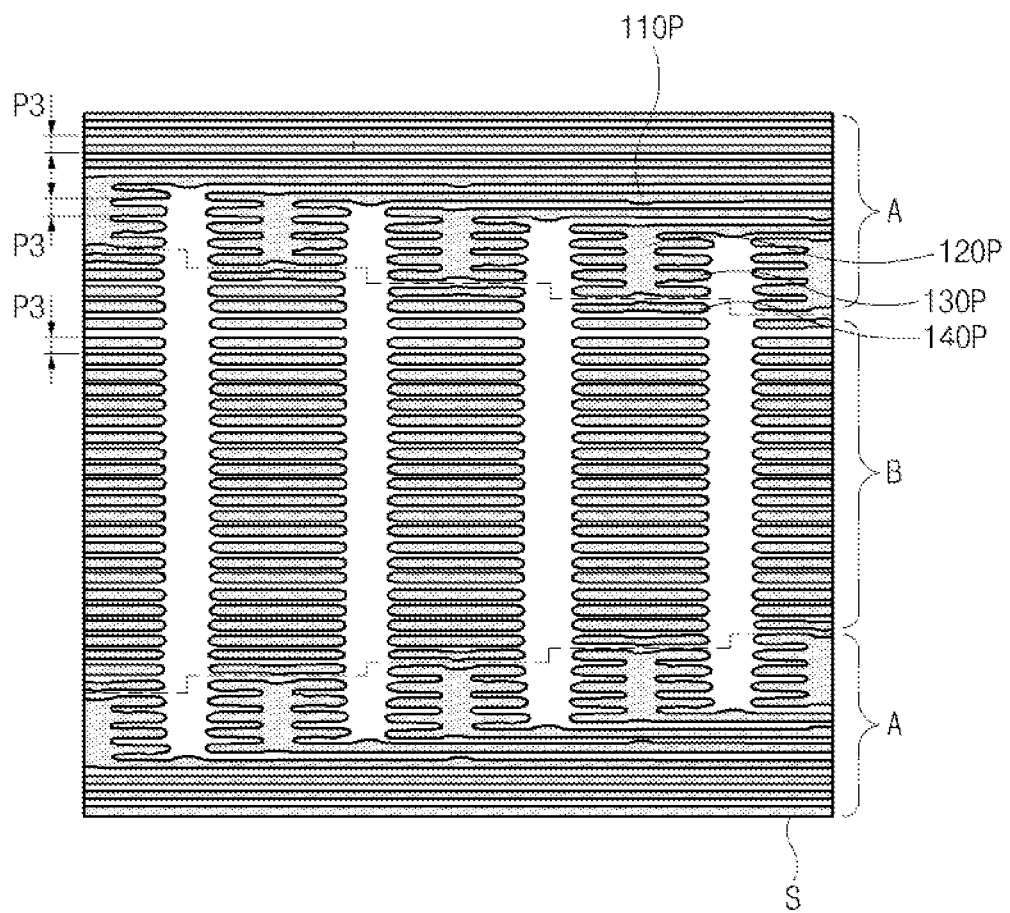
FIGS. 1A to 1D are views illustrating an X-decoder region of a semiconductor device according to an embodiment of the present invention.

Hereinafter, embodiments will be described in greater detail with reference to the accompanying drawings.

Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other layer or substrate, or intervening layers may also be present.

FIGS. 1A to 1D are views illustrating an X-decoder region of a semiconductor device according to an embodiment of the present invention. Although not shown, since the present invention includes forming fine patterns using spacer patterning technology (SPT), the following stacking structure may be included. The stacking structure includes a layer to be etched disposed over a semiconductor substrate, a partition layer disposed over the layer to be etched, and a hard mask layer disposed over the partition layer. However, the stacking structure is a general stacking structure required in spacer patterning. The present invention is not limited thereto and the stacking structure may be changed according to another embodiment.

As shown in FIG. 1A, the semiconductor device includes a semiconductor substrate S including a first region A straightly connected to a cell string region (not shown) and a second region B adjacent to the first region A. In the first region A, first partition patterns 110P are arranged in the same pitch P3; second partition patterns 120P are vertically connected to the first partition patterns 110P; and third partition patterns 130P overlap the second partition patterns 120P to be in parallel to the first partition patterns 110P. Fourth partition patterns 140P included in the second region B have the same width as the third partition patterns 130P, and are arranged in parallel to the third partition patterns 130P.

The first region A and the second region B may include an X-decoder region of a flash memory device. The third partition patterns 130P and the fourth partition patterns 140P may have the same pitch P3 as the first partition pattern 110P and arranged in parallel to the first partition patterns 110P. Further, edges of the third partition patterns 130P are arranged on an extending line perpendicular to edges of the first partition pattern 110P.

The first partition patterns 110P, third partition patterns 130P, and fourth partitions 140P include a line and space pattern.

In the embodiment of the present invention, the third partition pattern 130P and the fourth partition pattern 140P are arranged to have the same pitch as the first partition pattern 110P connected to a pattern of the cell string region. The third partition pattern 130P and the fourth partition pattern 140P are arranged in parallel to the first partition pattern 110P so that an exposure process margin can be improved. That is, in the related art, a portion connected to a line pattern and a pad pattern is formed to be divided like the third partition pattern 130P and the fourth partition pattern 140P so that focal depth is increased and thus failure such as a bridge in the connection portion of the line pattern and the pad pattern can be prevented. The CD uniformity in the X-decoder region of the flash memory device can be improved, so that the patterning is easily performed.

FIG. 1A illustrates a process of patterning a partition layer to form a partition pattern. When the patterning is not easily performed only using a photoresist pattern, a hard mask layer may be further provided on the partition layer to perform the patterning.

Figure 1B:
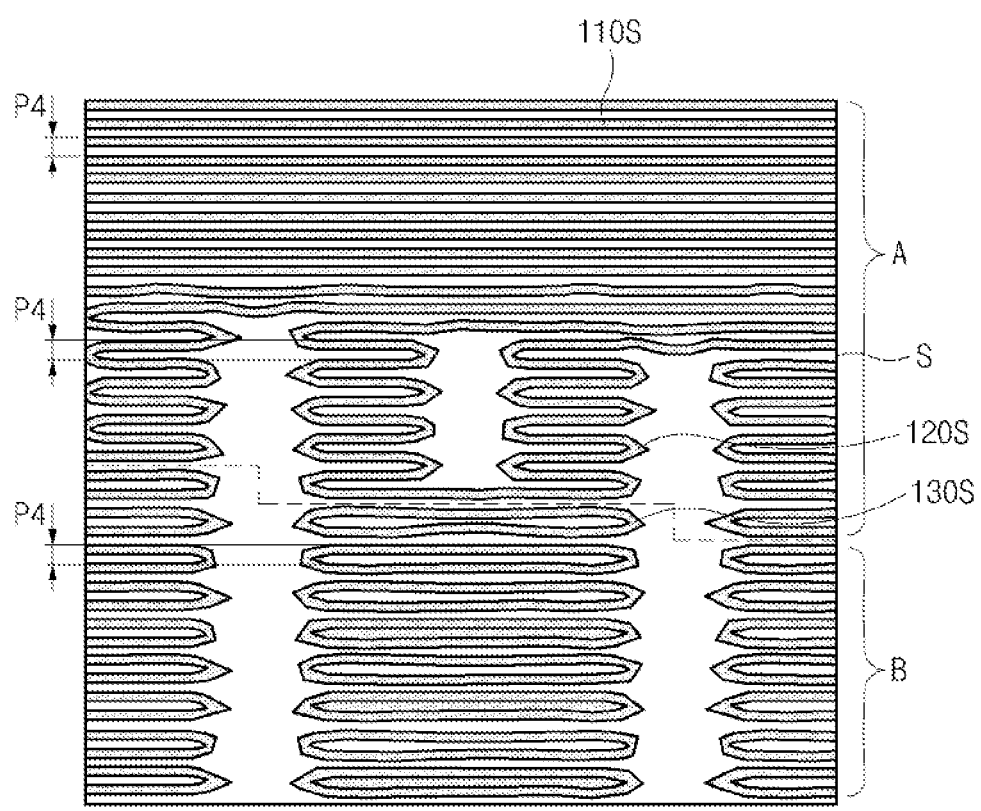

As shown in FIG. 1B, a spacer material is coated on the partition patterns 110P, 120p, 130p, and 140P illustrated in FIG. 1A and then etched back to form spacer patterns on sidewalls of the partition patterns. The spacer patterns include a first spacer pattern 110S formed on a sidewall of the first partition pattern (110P of FIG. 1A) in the first region A and connected to the cell string region (not shown), a second spacer pattern 120S formed on a sidewall of the second partition pattern (120P of FIG. 1A) and a sidewall of the third partition pattern (130P of FIG. 1A) and connected to the first spacer pattern 110S, and a third spacer pattern 130S formed on a sidewall of the fourth partition pattern (140P of FIG. 1A) in the second region B.

At this time, the first spacer pattern 110S, second spacer pattern 120S, and third spacer pattern 130S may have the same pitch P4 as each other and have a pitch of ½ of the partition pattern pitch P3. Further, the spacer pattern 120S includes a shape in which "S" shaped are continuously connected in a zigzag shape and the third spacer pattern 130S includes an essentially oval shape. One edge of the second spacer pattern 120S and one edge of the third spacer pattern 130S may be arranged on an extending line perpendicular to the edge of the first spacer pattern 110S.

FIG. 1B illustrates a process of forming the spacer pattern, and the partition pattern may be removed after the spacer pattern is formed on the sidewall of the partition pattern.

Figure 1C:
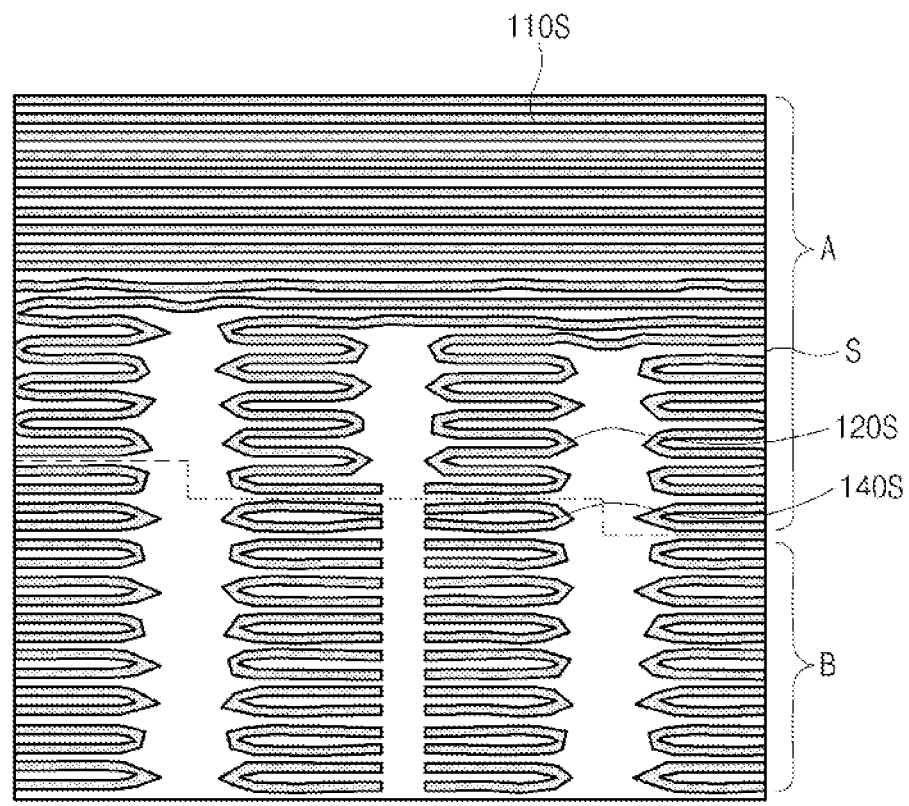

As shown in FIG. 1C, a central portion of the third spacer pattern 130S is removed using a cutting mask pattern (not shown) covering the central portion of the third spacer pattern 130S as an etch mask to form a fourth spacer pattern 140S. To remove the central portion of the third spacer pattern 130S is to electrically separate a first pad pattern 200 (see FIG. 1D) from a second pad pattern 300 (see FIG. 1D) to be formed in a subsequent process.

Figure 1D:
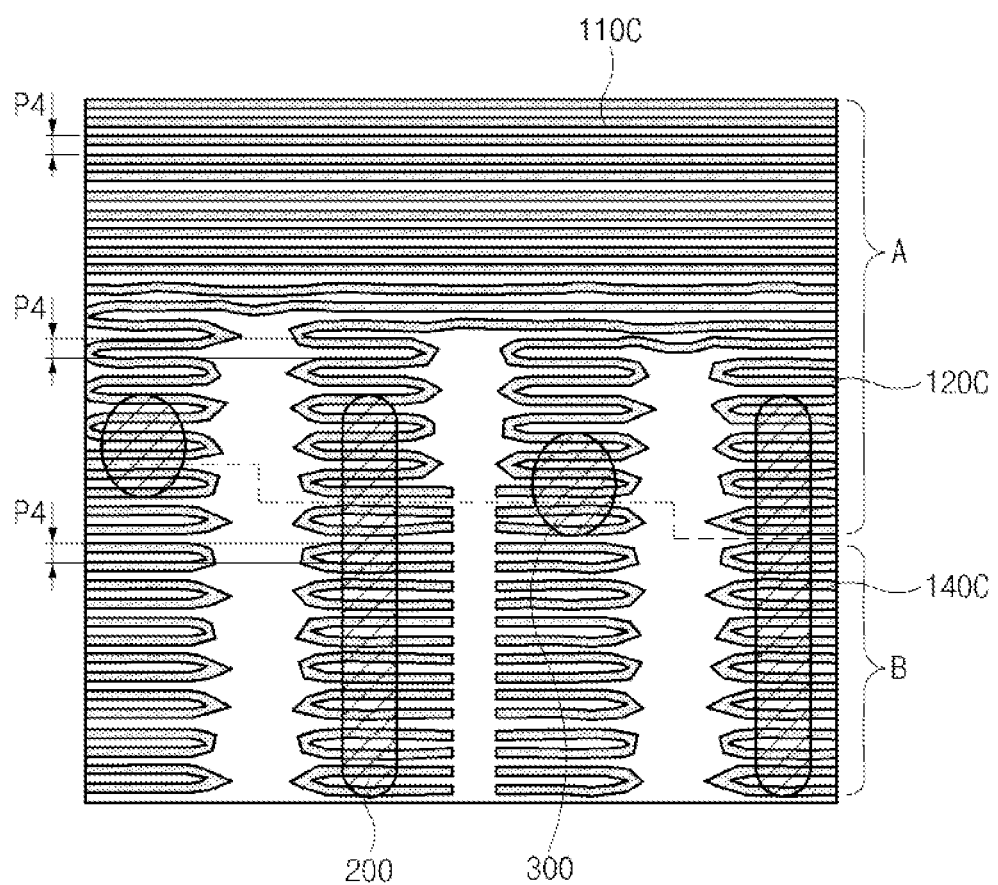

As shown in FIG. 1D, the layer to be etched formed below the spacer patterns is etched using the spacer patterns as a mask to form conductive patterns. Here, the conductive patterns include first conductive patterns 110C which are formed by etching the layer to be etched using the first spacer patterns 110S as an etch mask, second conductive patterns 120C which are formed by etching the layer to be etched using the second spacer patterns 120S as an etch mask, and third conductive patterns 140C which are formed by etching the layer to be etched using the fourth spacer patterns 140S as an etch mask. The first conductive patterns 110C are a line and space type pattern connected to a cell string (not shown) in the first region A and arranged to have the same pitch P4. The second conductive pattern 120C is connected to the first conductive pattern 110C in the first region A and arranged in a shape in which "S" shaped are continuously connected in a zigzag shape. The third conductive pattern 140C is spaced from the second conductive pattern 120C in the second region B and arranged in an essentially oval shape in which a central portion thereof is divided. The second conductive pattern 120C and the third conductive pattern 140C have the same pitch P4 as the first conductive pattern 110C.

Then, the first pad pattern 200 and the second pad pattern 300 connected to at least the second conductive patterns 120S may be formed. The first pad pattern 200 and the second pad pattern 300 may be spaced from each other and connected to the third conductive pattern 140C. The first pad pattern 200 may be longer than the second pad pattern 300. Next, a metal interconnection (not shown) may be formed on the first pad pattern 200 and the second pad pattern 300.

In accordance with an embodiment of the present invention, the first conductive pattern 110C corresponds to a word line of the cell string (not shown), and the second conductive pattern 120C is extended to be coupled to the word line. In addition, the first pad pattern 200 and the second pad pattern 300 may receive signals and transfer the signals to word lines of the cell string (not shown).

In the semiconductor device of the embodiment described above, the patterns arranged in the X-decoder region including the first region A and the second region B have the same pitch as the line pattern connected to the cell string so that the failure such as a bridge generated in the X-decoder region can be reduced.

FIGS. 2A to 2D are views illustrating an X-decoder region of a semiconductor device according to another exemplary embodiment. Although not shown, since the present invention includes technology for forming fine patterns using SPT, the following stacking structure may be included. The stacking structure includes a layer to be etched disposed over a semiconductor substrate, a partition layer disposed over the layer to be etched, and a hard mask layer disposed over the partition layer. However, the stacking structure is a general stacking structure required in spacer patterning. The present invention is not limited thereto, and the stacking structure may be changed according to another embodiment.

Figure 2A:
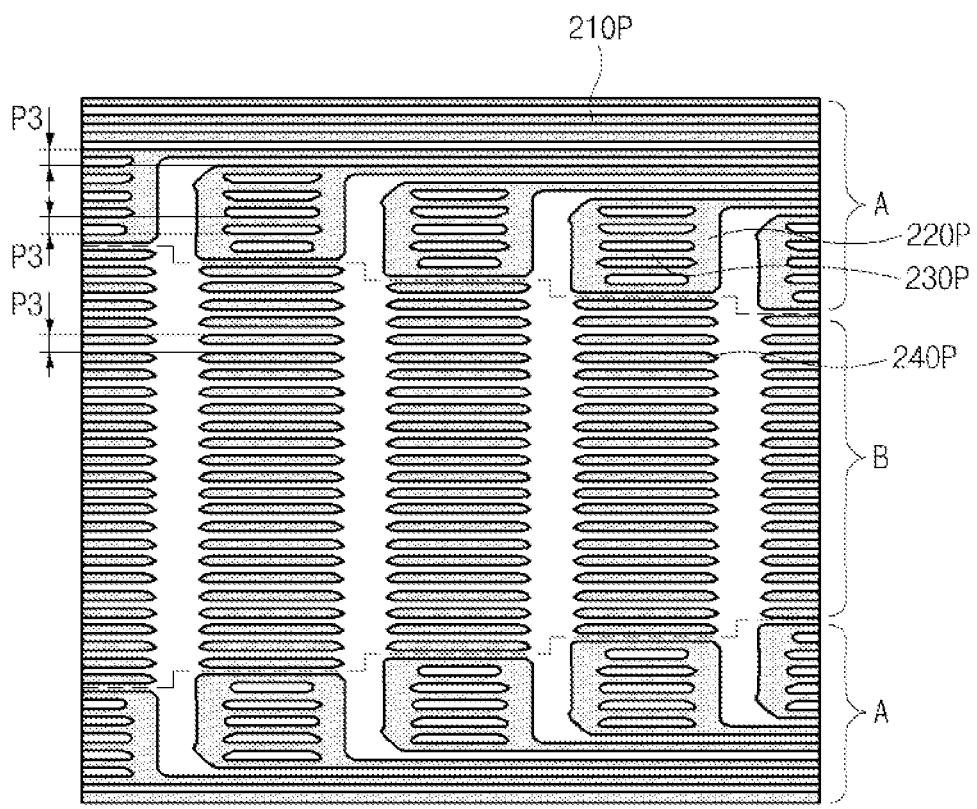
FIGS. 2A to 2D are views illustrating an X-decoder region of a semiconductor device according to another embodiment of the present invention.

As shown in FIG. 2A, the semiconductor device includes a semiconductor substrate including a first region A straightly connected to a cell string region (not shown) and a second region B adjacent to the first region A. In the first region A, first partition patterns 210P are arranged in the same pitch P3; second partition patterns 220P are vertically connected to edges of the first partition patterns 210P and spaced from each other; and third partition patterns 230P are arranged between the spaced second partition patterns 220P to be in parallel to the first partition patterns 210P. Fourth partition patterns 240P included in the second region B have the same width as the third partition patterns 230P and are arranged in parallel to the third partition patterns 230P.

The first region A and the second region B may include an X-decoder region of a flash memory device. The third partition patterns 230P and the fourth partition patterns 240P may have the same pitch P3 as the first partition patterns 210P and arranged in parallel to the first partition patterns 210P. Further, edges of the fourth partition patterns 240P are arranged on an extending line of the second partition pattern 220P in a length direction thereof.

The first partition patterns 210P, second partition patterns 220P, third partition patterns 230P, and fourth partitions 240P include a line and space pattern.

In the embodiment of the present invention, the third partition pattern 230P and the fourth partition pattern 240P are arranged to have the same pitch as the first partition pattern 210P connected to a pattern of the cell string region. The third partition pattern 230P and the fourth partition pattern 240P are arranged in parallel to the first partition pattern 210P so that an exposure process margin can be improved. That is, in the related art, a portion connected to a line pattern and a pad pattern is formed to be divided like the third partition pattern 230P and the fourth partition pattern 240P so that focal depth is increased and failure such as a bridge in the connection portion of the line pattern and the pad pattern can be prevented. Therefore, the CD uniformity in the X-decoder region of the flash memory device can be improved, so that the patterning is easily performed.

FIG. 2A illustrates a process of patterning a partition layer to form a partition pattern. When the patterning is not easily performed only using a photoresist pattern, a hard mask layer may be further provided on the partition layer to perform the patterning.

Figure 2B:
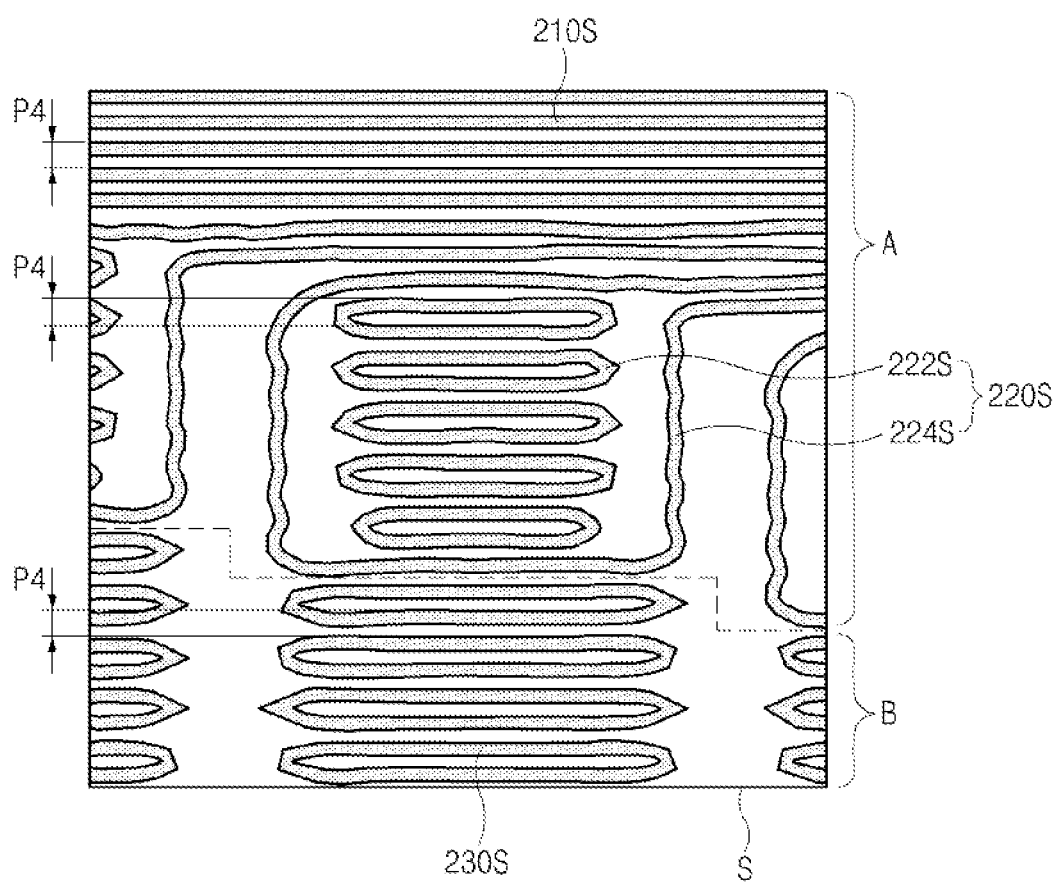

As shown in FIG. 2B, a spacer material is coated on the partition patterns 210P, 220p, 230p, and 240P illustrated in FIG. 2A and then etched back to form spacer patterns on sidewalls of the partition patterns. The spacer patterns include a first spacer pattern 210S formed on a sidewall of the first partition pattern (210P of FIG. 2A) in the first region A and connected to the cell string region (not shown), a second spacer pattern 220S formed on a sidewall of the second partition pattern (220P of FIG. 2A) and a sidewall of the third partition pattern (230P of FIG. 2A) and connected to the first spacer pattern 210S, and a third spacer pattern 230S formed on a sidewall of the fourth partition pattern (240 of FIG. 2A) in the second region B.

At this time, the first spacer pattern 210S, second spacer pattern 220S, and third spacer pattern 230S may have the same pitch P4 as each other and have a pitch of ½ of the partition pattern pitch P3. Further, the second spacer pattern 220S includes a first pattern 222S arranged to be in parallel to the first pacer pattern 210S and having an essentially oval shape and a second pattern 224S surrounding the first pattern 222S and connected to adjacent first spacer patterns 210S. The third spacer pattern 230S may include an essentially oval shape and be longer than the first pattern 222S of the second spacer pattern 220S.

FIG. 2B illustrates a process of forming the spacer pattern, and the partition pattern may be removed after the spacer pattern is formed on the sidewall of the partition pattern.

Figure 2C:
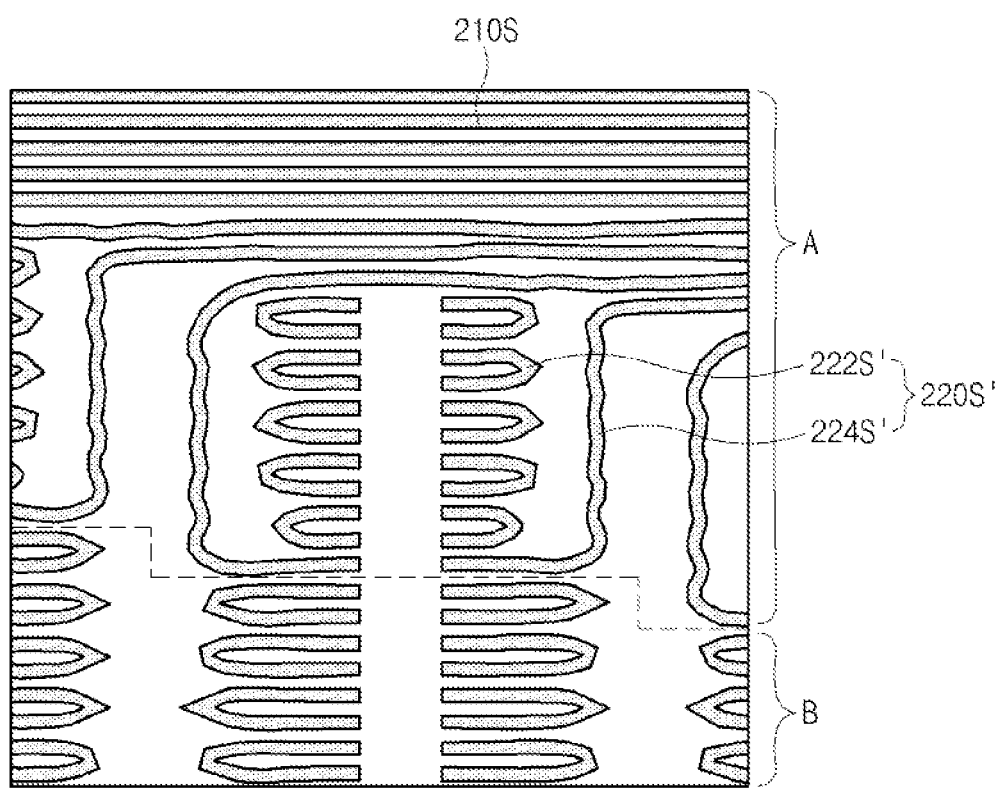

As shown in FIG. 2C, central portions of the second and third spacer pattern 220S and 230S are removed using a cutting mask pattern (not shown) covering the central portions of the second and third spacer patterns 220S and 230S as an etch mask so that the second pacer pattern 220S and the third spacer pattern 230S are divided. To remove the central portions of the second and third spacer patterns 220S and 230S is to electrically separate a first pad pattern 400 (see FIG. 2D) from a second pad pattern 500 (see FIG. 2D) to be formed in a subsequent process.

Figure 2D:
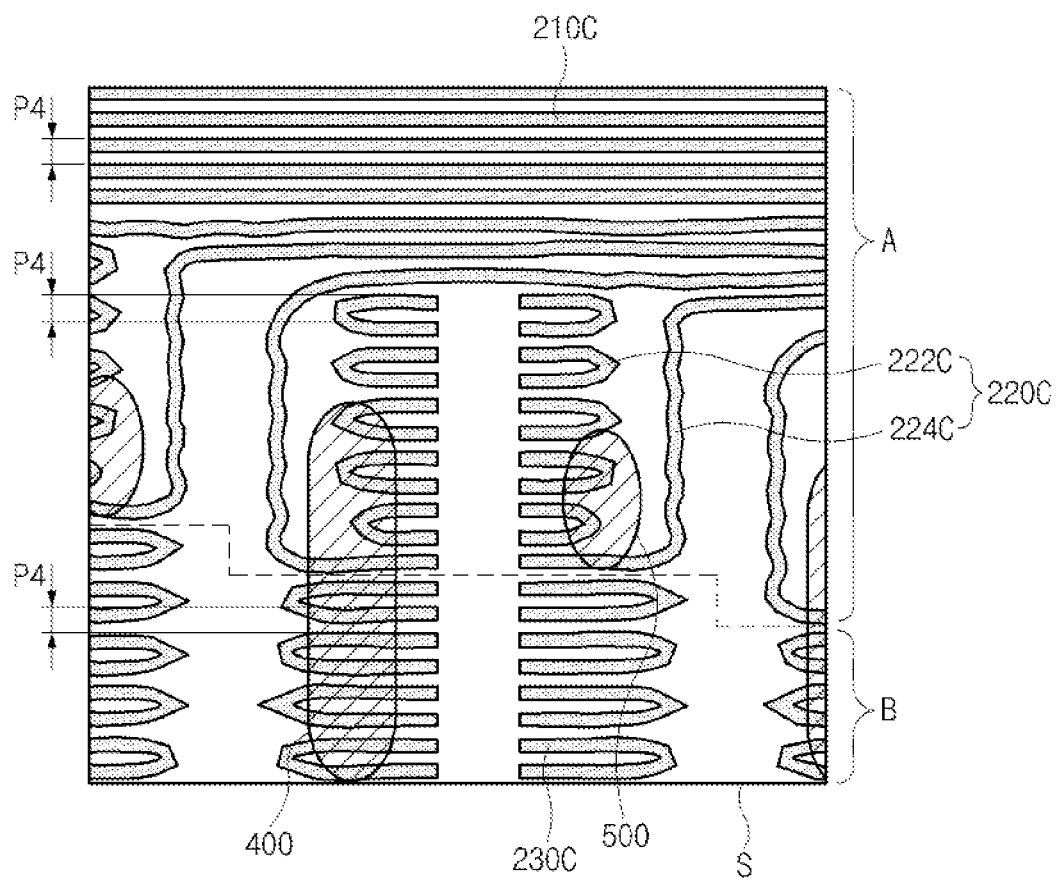

As shown in FIG. 2D, the layer to be etched formed below the spacer patterns is etched using the spacer patterns as a mask to form conductive patterns. The conductive patterns include first conductive patterns 210C which are formed by etching the layer to be etched using the first spacer patterns 210S as an etch mask, second conductive patterns 220C which are formed by etching the layer to be etched using the second spacer patterns 220S as an etch mask, and third conductive patterns 230C which are formed by etching the layer to be etched using the third spacer patterns 230S as an etch mask. The first conductive patterns 210C have a line and space pattern connected to a cell string (not shown) in the first region A and arranged to have the same pitch P4. The second conductive pattern 220C includes a first pattern 222C arranged to be in parallel to the first conductive pattern 210C and having an essentially oval shape in which a central portion thereof is divided and a second pattern 224C surrounding the first pattern 222C and connected to adjacent first conductive patterns 210C. The third conductive pattern 230C may be arranged to be spaced from the second conductive pattern 220C and have an essentially oval shape in which a central portion thereof is divided. The second conductive patterns 220C and the third conductive patterns 230C have the same pitch P4 as the first conductive pattern 210C.

Then, the first pad pattern 400 and the second pad pattern 500 connected to the second conductive patterns 220S may be formed. The first pad pattern 400 and the second pad pattern 500 may be spaced from each other, and the first pad pattern 400 is connected to the third conductive patterns 230C. The first pad pattern 400 may be longer than the second pad pattern 500. Next, a metal interconnection (not shown) may be formed on the first pad pattern 400 and the second pad pattern 500.

In accordance with an embodiment of the present invention, the first conductive pattern 210C corresponds to a word line of the cell string (not shown), and the second conductive pattern 220C is extended to be coupled to the word line. In addition, the first pad pattern 400 and the second pad pattern 500 may receive signals and transfer the signals to word lines of the cell string (not shown).

In the semiconductor device of the embodiment described above, the patterns arranged in the X-decoder region including the first region A and the second region B have the same pitch as the line pattern connected to the cell string so that the failure such as a bridge generated in the X-decoder region can be reduced.

Figure 3A:
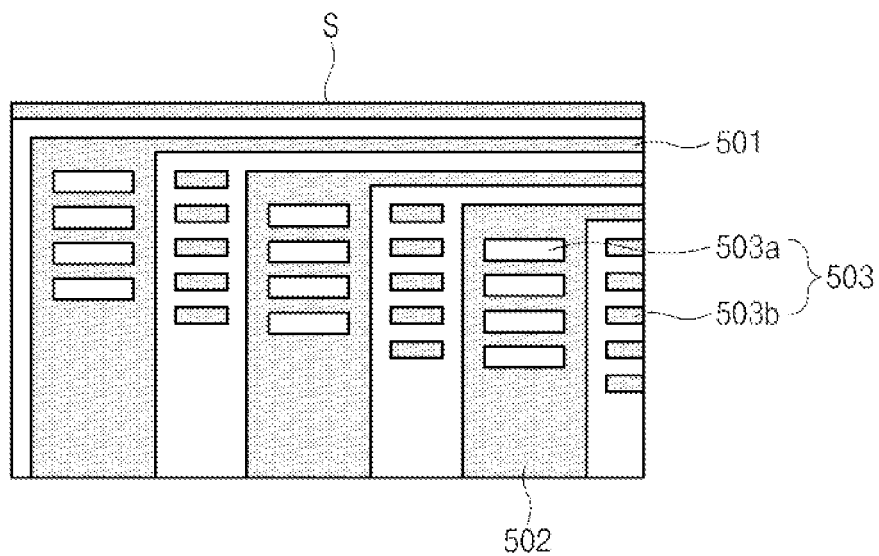
FIGS. 3A to 3C are views illustrating an X-decoder region of a semiconductor device according to still another embodiment of the present invention.
Figure 3B:
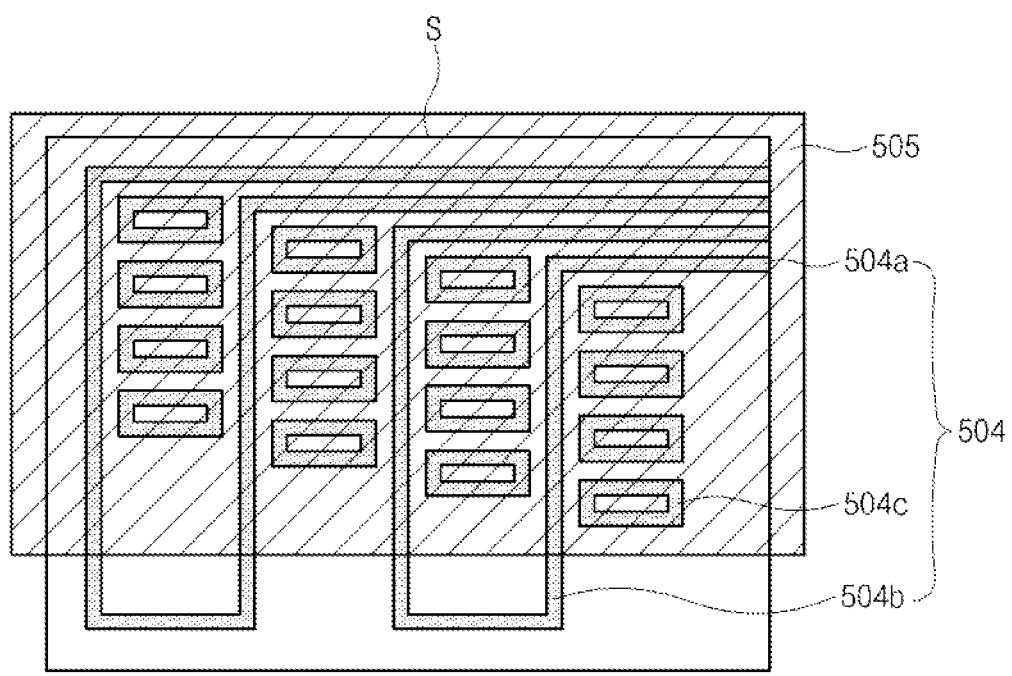
Figure 3C:
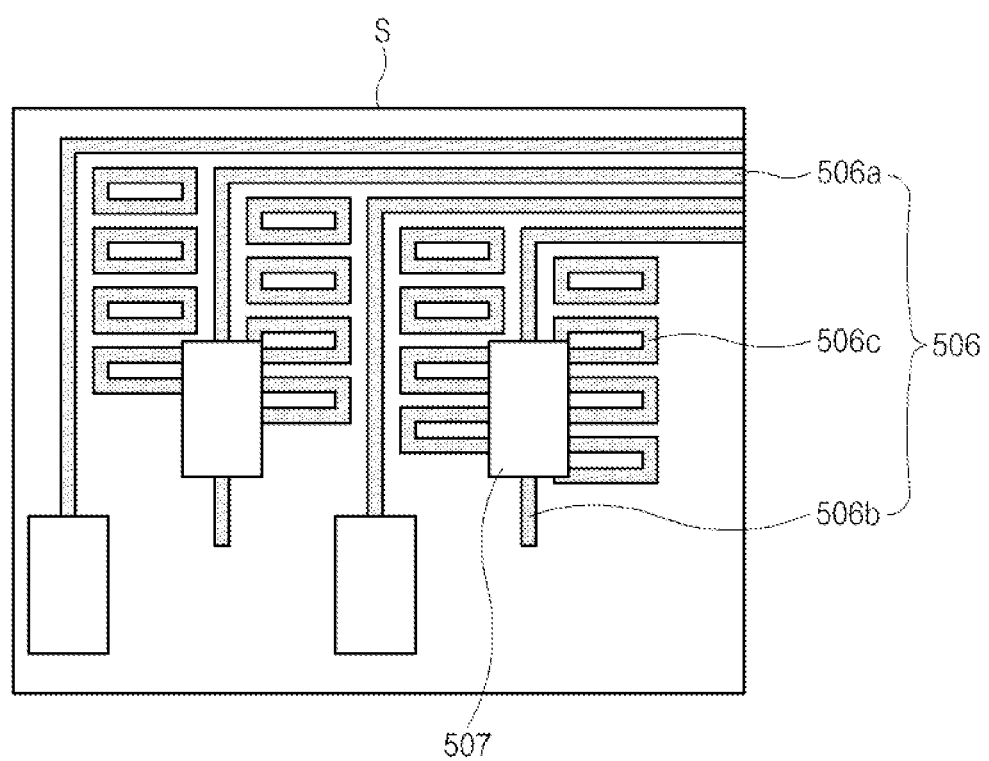

FIGS. 3A to 3C are views illustrating an X-decoder region of the semiconductor device according to still another embodiment.

As shown in FIG. 3A, the semiconductor device includes a line pattern 501 straightly connected to a cell string region (not shown) and a pad pattern 502 provided in an edge of the line pattern 501, over a semiconductor substrate S. A region including the line pattern 501 and the pad pattern 502 may include an X-decoder region. Here, the line pattern 501 has a pitch different from that of the pad pattern 502. Specifically, the pitch of the pad pattern 502 is larger than that of the line pattern 501.

An auxiliary pattern 503 may be provided in the pad pattern 502 and a space between the pad patterns 502. Here, the auxiliary pattern 503 includes a first auxiliary pattern 503a provided in the pad pattern 502 and a second auxiliary pattern 503b provided in the space between the pad patterns 502. The first auxiliary pattern 503a has a line and space pattern, and the second auxiliary pattern 503b has an island type. Further, a width of the auxiliary pattern 503 may be the same as that of the line pattern 501. One or more of auxiliary patterns 503 may be inserted in a range in which a patterning margin of the line pattern 501 and the pad pattern 502 can be improved. Thus, the auxiliary pattern 503 serves to increase focal depth of the line pattern 501 and the pad pattern 502 to cause the patterning to be easily performed. That is, the pitches of the patterns in the X-decoder region are different to prevent occurrence of a failure such as a bridge between the line pattern 501 and the pad pattern 502.

As shown in FIG. 3B, spacer patterning is performed on the line pattern (501 of FIG. 3A), pad pattern (502 of FIG. 3A), and auxiliary pattern (503 of FIG. 3A) to form spacer patterns 504 on sidewalls thereof. More specifically, the spacer patterns 504 are formed by forming an insulating layer on the line pattern 501, pad pattern 502, and auxiliary pattern 503 and then etching back the insulating layer. The spacer pattern 504 includes a first spacer pattern 504a formed on a sidewall of the line pattern 501, a second spacer pattern 504b formed on a sidewall of the pad pattern 504, and a third spacer pattern 504c formed on a sidewall of the auxiliary pattern 503. Then, the line pattern 501, pad pattern 502, and auxiliary pattern 503 are removed. Subsequently, a cutting mask 505 covering the first spacer pattern 504a, a portion of the second spacer pattern 504b, and the third spacer pattern 504c is formed to expose an edge of the second spacer pattern 504b.

As shown in FIG. 3C, the edge of the second spacer pattern 504b is removed using the cutting mask 505 as an etch mask, so that the second spacer pattern 504b is divided. Although not shown, a conductive layer below the spacer pattern 504 is etched using the spacer pattern 504 as an etch mask to form a conductive pattern 506. The conductive pattern 506 includes first conductive patterns 506a straightly connected to the cell string region, second conductive patterns 506b provided perpendicular to the first conductive patterns 506a and spaced from each other, and third conductive patterns 506c provided between the second conductive patterns 506b and including a space in a central portion thereof. Here, the first conductive patterns 506a may have a line and space type, the second conductive pattern 506b may have a line and space type perpendicular to the first conductive patterns 506a, and the third conductive patterns 506c may have an island type including a space. Next, contact pads 507, which are connected to the second conductive patterns 506b and obliquely spaced from each other, may be formed.

In accordance with an embodiment of the present invention, the first conductive pattern 506a corresponds to a word line of a cell string (not shown), and the second conductive pattern 506b is extended to be coupled to the word line. In addition, the contact pad 507 may receive a signal and transfer the signal to a word line of the cell string (not shown).

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device, comprising:
   a semiconductor substrate including a first region coupled to a cell string region and a second region adjacent to the first region;
   first conductive patterns having a first pitch and disposed in the first region;
   second conductive patterns each of which is coupled to a corresponding one of the first conductive patterns in the first region and has a structure in which S shaped are continuously connected in a zigzag shape; and
   third conductive patterns spaced from the second conductive patterns in the second region and having an essentially oval shape in which a central portion thereof is divided.

2. The semiconductor device of claim 1, wherein the first conductive patterns are formed in a line and space type.

3. The semiconductor device of claim 1, wherein the second conductive patterns and the third conductive patterns are arranged to have substantially the same pitch as the first conductive patterns.

4. The semiconductor device of claim 1, wherein the first region and the second region include an X-decoder region of the semiconductor device.

5. The semiconductor device of claim 1, further comprising:
   a first pad pattern coupled to a corresponding one of the second conductive patterns; and
   a second pad pattern spaced from the first pad pattern and coupled to a corresponding one of the second conductive patterns,
   wherein the first pad pattern and the second pad pattern are electrically isolated from each other.

6. The semiconductor device of claim 5, wherein the first pad pattern and the second pad pattern are coupled to a first portion and a second portion of a corresponding one of the third conductive patterns, respectively, and wherein the first portion and the second portion of the third conductive pattern are separated from each other by the divided central portion.

7. The semiconductor device of claim 5, further comprising a metal interconnection provided over the first pad pattern and the second pad pattern.

8. The semiconductor device of claim 1, wherein the first pitch is substantially the same as a cell pitch of the semiconductor device.

9. The semiconductor device of claim 1, wherein the first conductive patterns correspond to word lines of the cell string region.

10. A semiconductor device, comprising:
    a semiconductor substrate including a first region coupled to a cell string region and a second region adjacent to the first region;
    first conductive patterns having a first pitch in the first region;
    second conductive patterns including first patterns arranged in parallel to the first conducive patterns in the first region and having an essentially oval shape in which a central portion thereof is divided and second patterns surrounding the first patterns and coupled to adjacent first conductive patterns; and
    third conductive patterns spaced from the second conductive patterns in the second region and having an essentially oval shape in which a central portion thereof is divided.

11. The semiconductor device of claim 10, wherein the first conductive patterns are formed in a line and space type.

12. The semiconductor device of claim 10, wherein the second conductive patterns and the third conductive patterns are arranged to have substantially the same pitch as the first conductive patterns.

13. The semiconductor device of claim 10, wherein the first region and the second region include an X-decoder region of the semiconductor device.

14. The semiconductor device of claim 10, further comprising:
    a first pad pattern coupled to a first portion of the second conductive patterns; and
    a second pad pattern spaced from the first pad pattern and coupled to a second portion of the second conductive patterns,
    wherein the first portion and the second portion of the second conductive pattern are electrically isolated from each other by the divided central portion.

15. The semiconductor device of claim 14, wherein the first pad pattern is further coupled to the third conductive patterns.

16. The semiconductor device of claim 14, further comprising a metal interconnection provided over the first pad pattern and the second pad pattern.

17. The semiconductor device of claim 10, wherein the first pitch is substantially the same as a cell pitch of the semiconductor device.

18. The semiconductor device of claim 10, wherein the first conductive patterns correspond to word lines of the cell string region.

19. A semiconductor device, comprising:
    first conductive patterns coupled to a cell string region;
    second conductive patterns perpendicularly coupled to the first conductive patterns and spaced from the first conductive patterns; and
    third conductive patterns provided between the second conductive patterns spaced from each other and including spacers in center portions thereof.

20. The semiconductor device of claim 19, wherein the first conductive patterns and the second conductive patterns have a line and space type.

21. The semiconductor device of claim 19, wherein the third conductive patterns have an island type.

22. The semiconductor device of claim 19, wherein the first conductive patterns, the second conductive patterns, and the third conducive patterns are provided in an X-decoder region.

23. The semiconductor device of claim 19, further comprising contact pads coupled to the second conductive patterns and obliquely spaced from each other.

24. The semiconductor device of claim 19, wherein the first conductive patterns correspond to word lines of the cell string region.

* * * * *